(12) United States Patent
Park et al.

(10) Patent No.: US 7,008,758 B2
(45) Date of Patent: Mar. 7, 2006

(54) METHOD OF FORMING A PATTERNED FILM OF SURFACE-MODIFIED CARBON NANOTUBES

(75) Inventors: Jong Jin Park, Gyeonggi-Do (KR); Jae Jun Lee, Gyeonggi-Do (KR); Myung Sup Jung, Daejeon-Shi (KR)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 64 days.

(21) Appl. No.: 10/713,254

(22) Filed: Nov. 17, 2003

(65) Prior Publication Data

US 2004/0101634 A1    May 27, 2004

(30) Foreign Application Priority Data

Nov. 19, 2002    (KR) ...................... 10-2002-0072017

(51) Int. Cl.
G03F 7/038 (2006.01)
G03F 7/20 (2006.01)
G03F 7/30 (2006.01)

(52) U.S. Cl. ...................... 430/325; 430/311; 430/327; 430/330

(58) Field of Classification Search ............. 430/270.1, 430/325, 331, 330, 281.1, 283.1, 285.1, 286.1, 430/287.1, 288.1
See application file for complete search history.

(56) References Cited

U.S. PATENT DOCUMENTS

| 4,439,291 A | * | 3/1984 | Irving et al. ................... 522/34 |
| 5,561,026 A | * | 10/1996 | Aoki ........................... 430/196 |
| 6,811,957 B1 | * | 11/2004 | Mau et al. .................. 430/315 |
| 2001/0050219 A1 | * | 12/2001 | Anazawa et al. ........... 204/173 |

OTHER PUBLICATIONS

Liu et al, Chemical Physis Letters, 1999, pp. 125-129.
Hamada et al, The American Physical Society, New One-Dimensional Conductors: Graphitic Microtubules, vol. 68, No. 10, 1992, pp. 1579-1581.
Saito et al, The American Physical Society, Electronic Structure of Graphene Tubules Based on C60, vol. 46, No. 3, 1992 pp. 1804-1811.
Liu et al, Langmuir, The ACS Journal of Surfaces and Colloids, vol. 16, No. 8, 2000, pp. 3569-3573.

* cited by examiner

Primary Examiner—Sin Lee
(74) Attorney, Agent, or Firm—Harness Dickey & Pierce PLC

(57) ABSTRACT

Disclosed herein is a method of forming a negative pattern of carbon nanotubes through: modifying the surfaces of carbon nanotubes to have double bond-containing functional group capable of participating in radical polymerization; coating a substrate with a liquid coating composition prepared by dispersing the surface-modified carbon nanotubes in an organic solvent along with a photoinitiator; exposing the film to UV light through a photomask to induce radical polymerization of the carbon nanotubes; and developing the film. By virtue of the present invention, desired patterns of carbon nanotubes can be easily made on the surfaces of various substrates according to the conventional photolithography procedure.

11 Claims, No Drawings

METHOD OF FORMING A PATTERNED FILM OF SURFACE-MODIFIED CARBON NANOTUBES

BACKGROUND OF THE INVENTION

This non-provisional application claims priority under 35 U.S.C. § 119(a) on Patent Application No. 2002-72017 filed in Korea on Nov. 19, 2002, which is herein incorporated by reference.

1. Field of the Invention

The present invention relates to a method of forming a patterned film of carbon nanotubes via a photolithography process by using surface-modified carbon nanotubes, whereby double-bond-containing functional groups are introduced into the surfaces of the carbon nanotubes. More specifically, the present invention relates to a method of forming a negative pattern of carbon nanotubes by modifying carbon nanotubes by introducing double bond-containing functional groups that can go through radical polymerization into the surfaces of the carbon nanotubes; coating a substrate with a liquid coating composition prepared by dispersing the surface-modified carbon nanotubes in an organic solvent along with a photoinitiator; exposing the film to UV light through a photomask to induce photo-polymerization of the double bond on the surface of the carbon nanotubes; and developing the film.

2. Related Art

Since carbon nanotubes were found by Dr. Iijima at Maijo University of Japan in 1991 while researching electro-microscopic observation, many studies of carbon nanotubes have been profoundly made. Typically, a carbon nanotube is a graphite sheet having a hollow cylinder structure with an inner diameter of 1 to 20 nm.

In graphite that has been known to have a peculiar structure, covalent bonds between carbon atoms are arranged in such an unusual style that graphite has the shape of a rigid, flat, hexagonal sheet. The upper and lower regions of the sheet are filled with dispersed free electrons that are maintaining their motion parallel to the sheet. In order to form carbon nanotubes, the graphite sheet is configured to be spirally wound and in this structure, edge bonds are formed at different sites. Generally, various electrical properties of the carbon nanotube are believed to be a function of its structure and diameter (*Phys. Rev.* (1992) B46:1804 and *Phys. Rev. Lett.* (1992) 68:1579). Thus, changing the spiral shape or chirality of the carbon nanotube results in a change in the free electrons motion, and, in terms of the free electrons' motion, the carbon nanotubes exhibit a conductivity from metallic material to a semiconductor. As a semiconductor, the range of the barrier voltage for free electrons to overcome varies with the tube's diameter and, in case of the smallest diameter, the voltage can be as low as 1 eV. In other words, it is possible for carbon nanotubes to have various electrical properties from those of insulator to those of semiconductors or metals, depending on the structure and diameter. In addition, not only do the carbon nanotubes show mechanical durability and chemical stability but they have a hollow cylindrical structure having a small diameter and a long length. Thanks to all these characteristics, the possible application fields of the carbon nanotubes becomes wider, including flat-panel displays (FPD), transistors, energy storing material and electronic devices of nano-size.

Recently, a method of arranging carbon nanotubes on a gold substrate was reported by Zhongfan Liu at Beijing University, the People's Republic of China, wherein every end of the carbon nanotube was modified with sulfur (*Langmuir* (2000) 16:3569). Another method was reported by Smalley at Rice University, U.S.A., wherein the method comprises the steps of: forming a self-assembled monolayer of trimethylsilyl groups on a silicone substrate; patterning the monolayer using electron beams; attaching amine groups to the pattern; and attaching carbon nanotubes to the amine groups (*Chemical Physics Letters* (1999) 303:125). However, this method is not thought to be advantageous because the self-assembled monolayer of trimethylsilyl groups is very unstable and susceptible to a change of surroundings.

SUMMARY OF THE INVENTION

The present invention features a method of forming a patterned film of carbon nanotubes by chemically-modifying the surfaces of carbon nanotubes with double bond-containing functional groups and photo-curing the surface-modified carbon nanotubes.

In accordance with one aspect of the present invention, there is provided a method of forming a negative pattern of carbon nanotubes, wherein the method comprises the steps of:

(a) Providing surface-modified carbon nanotubes by introducing double bond-containing functional groups into the surface of carbon nanotubes;

(b) dispersing the surface-modified carbon nanotubes in an organic solvent along with a photoinitiator to obtain a liquid coating composition;

(c) applying the liquid coating composition onto a substrate and evaporating the organic solvent through prebaking to provide a coating film on the substrate;

(d) exposing the coating film to UV light through a photomask having a desired pattern to induce photo-polymerization of the carbon nanotubes in exposed areas of the coating film; and (e) developing the coating film with an organic developer to remove unexposed areas of the coating film and provide a negative pattern of carbon nanotubes.

All of the above features and other features of the present invention will be successfully achieved from the present invention described hereinbelow.

DETAILED DESCRIPTION OF THE INVENTION

As a result of much effort, the present inventors have accomplished the present invention of providing an insoluble monolayer or pattern of carbon nanotubes by using modified carbon nanotubes with double bond-containing functional groups and inducing the cross-linking of the functional groups by UV radiation in the presence of a photoinitiator.

A detailed description of the present invention is provided below.

The double bond-containing compounds used in the present invention have the structure of Formula 1 or Formula 2:

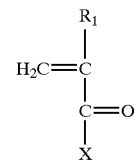

Formula 1

(wherein, $R_1$ is H or $CH_3$; and X is Cl, $NH_2$ or OH); and

Formula 2

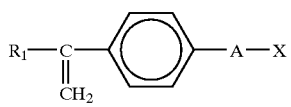

(wherein, $R_1$ is H or $CH_3$; A is $C_1$~$C_6$ alkylene or

(in which $R_2$ is direct bond or $C_1$~$C_6$ alkylene) ; and X is Cl, $NH_2$ or OH).

In order to modifying the surfaces of carbon nanotubes with these double bond-containing compounds, the surfaces of carbon nanotubes undergo carboxylation prior to the modification. The carboxylation can be accomplished through any of the conventional methods well known in the art, and, for example, according to the following procedure:

First, carbon nanotubes are refluxed in a sonicator filled with a mixed acid solution of nitric acid:sulfuric acid=7:3 (v/v) for 24 hrs. Then, this slurry is filtered through a 0.2 μm polycarbonate filter, and the remaining solid matter is recovered and refluxed again in nitric acid at 90° C. for 45 hrs, followed by centrifugation at 12,000 rpm. At the completion of the centrifugation, a supernatant is recovered and filtered through a 0.1 μm polycarbonate filter. The remaining solid matter is recovered and completely dried to produce dry carbon nanotubes. The dry carbon nanotubes are dispersed in distilled water or dimethylformaldehyde(DMF), and the dispersion is filtered through a 0.1 μm polycarbonate filter to select carbon nanotubes over a certain size.

According to the present invention, the carboxylated carbon nanotubes are then added to an organic solvent such as DMF, 4-hydroxy-4-methyl-2-pentanone, ethylene glycol monoethyl ether and 2-methoxyethanol and dispersed evenly therein by ultrasonification. Subsequently, to the carbon nanotube dispersion is added a certain catalyst dissolved in an organic solvent, and this reaction mixture is sufficiently agitated. At this time, the catalyst is properly selected considering the type of double bond-containing compound of Formula 1 or Formula 2. For example, in case of using a compound wherein X=Cl, a basic catalyst, preferably triethylamine(TEA) can be used. To the reaction mixture, while maintaining the agitation, a double bond-containing compound is slowly added drop and dissolved in the same organic solvent as used in the dispersion, and then the reaction is continued for 7~10 hrs, preferably for 24 hrs at room temperature. If the reaction is exothermic, cooling of the reaction mixture, for example by means of an ice bath, is required. After a completion of the reaction, distilled water is added to the reaction mixture to afford some precipitate. The precipitate is recovered by filtration through a 0.2 μm polycarbonate filter and washed several times with water and diethylether so as to remove unreacted double bond-containing compounds, followed by vacuum drying at room temperature. As a result, carbon nanotubes whose surfaces are modified with double bond-containing functional groups are obtained. Existence of the double bond-containing functional groups on the surface of the carbon nanotube can be easily identified by Raman spectrum.

The carbon nanotubes that can be used in the present invention are not limited and include all of those commercially available. Preferably, the carbon nanotubes are used that are selected from the groups consisting of the ones produced by the arc discharge method, laser ablation method, high temperature filament plasma chemical vapor deposition method, microwave plasma chemical vapor deposition method, thermochemical vapor deposition method and thermal decomposition method. Frequently, the commercial carbon nanotubes are contaminated with carbon-containing by-products, such as amorphous carbon and fullerene($C_{60}$), as well as transition metal catalysts necessary for the tube's growth. Accordingly, they should be undergo a certain purifying process. In the present invention, any of the conventional methods of purifying carbon nanotubes can be used, and one of them is exemplified in the following. First, carbon nanotubes are refluxed in distilled water at 100° C. for 8~24 hrs, preferably for 12 hrs, and then recovered by filtration. The recovered carbon nanotubes are dried completely and washed with toluene so as to remove the carbon-containing by-products. The resulting soot is heated at 470° C. for 20~30 minutes, preferably for 20 minutes, followed by washing with a 6M HCl solution so as to remove metallic impurities. As a result, pure carbon nanotubes are obtained. Other purifying methods can be used as long as they do not hinder the objectives of the present invention.

In the present invention, photoinitiators used in the photopolymerization of the surface-modified carbon nanotubes can be classified into acetophenone-based photo initiators, benzoin-based photo initiators, benzophenone-based photo initiators and thioxantone-based photo initiators. Acetophenone-based photo initiators can be exemplified by, but are not limited to, 4-phenoxy dichloroacetophenone, 4-t-butyl dichloroacetophenone, 4-t-butyl trichloroacetophenone, diethoxyacetophenone, 2-hydroxy-2-methyl-1-phenyl-propane-1-one, 1-(4-isopropylphenyl)-2-hydroxy-2-methyl-propane-1-one, 1-(4-dodecylphenyl)-2-hydroxy-2-methyl-propane-1-one], 4-(2-hydroxyethoxy)-phenyl-(2-hydroxy-2-propyl)ketone], 1-hydroxy cyclohexyl phenyl ketone and 2-methyl-1-[4-(methylthio)phenyl]-2-morpholino-propane-1. Benzoin-based photoinitiators can be exemplified by, but are not limited to, benzoin, benzoin methyl ether, benzoin ethyl ether, benzoin isopropyl ether, benzoin isobutyl ether and benzyl dimethyl ketal. Benzophenone-based photoinitiators can be exemplified by, but are not limited to, benzophenone, benzoyl benzoic acid, benzoyl benzoic acid methyl ester, 4-phenyl benzophenone, hydroxy benzophenone, 4-benzoyl-4'-methyl diphenyl sulphide and 3,3'-dimethyl-4-methoxy benzophenone. Thioxanthone-based photoinitiators can be exemplified by, but are not limited to, thioxanthone, 2-chlorothioxanthone, 2-methylthioxanthone, 2,4-dimethylthioxanthone, 2-isopropylthioxanthone, 2,4-dichlorothioxanthone, 2,4-diethylthioxanthone and 2,4-diisopropylthioxanthone.

Besides the above photoinitiators, the present invention can also use special grade photoinitiators, such as 1-phenyl-1,2-propanedione-2-(O-ethoxycarbonyl)oxime, 2,4,6-trimethyl benzoyl diphenyl phosphine oxide, methyl phenylglyoxylate, benzil, 9,10-phenanthraquinone, camphorquinone, dibenzosuberone, 2-ethylanthraquinone, 4,4'-diethylisophthalophenone and 3,3',4,4'-tetra(t-butylperoxycarbonyl)benzophenone, as well as co-polymerizable photoinitiators as depicted in Formulas 3 to 6:

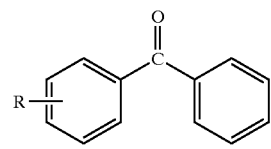

Formula 3

(wherein, R = (meth)acryl group);

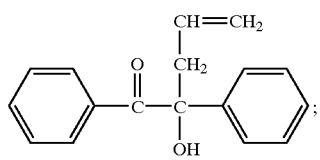

Formula 4

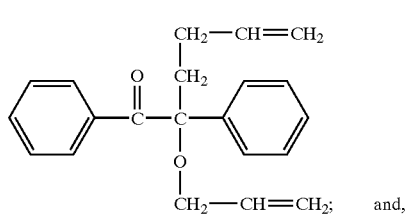

Formula 5 and,

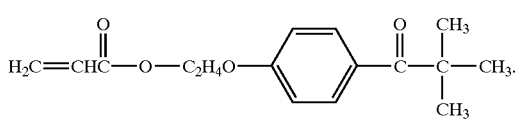

Formula 6

In the case that such a co-polymerizable photoinitiator is used, it is copolymerized with the surface-modified carbon nanotubes during photopolymerization induced by exposure to light.

Optionally, co-photoinitiators can be used with the photoinitiator. Examples of the co-photoinitiator include, without limitation, triethanolamine, methyldiethanolamine, triisopropanolamine, 4,4'-dimethylamino benzophenone, 4,4'-diethylamino benzophenone, 2-dimethylamino ethylbenzoate, 4-dimethylamino ethylbenzoate, 2-n-butoxyethyl-4-dimethylaminobenzoate, 4-dimethylamino isoamylbenzoate, 4-dimethylamino-2-ethylhexyl benzoate and Eosin Y.

According to the present invention, carbon nanotubes, whose surfaces are modified with double bond-containing functional groups as described above, are dispersed in an organic solvent along with one or more photoinitiators and, optionally, one or more co-photoinitiators to produce a liquid coating composition. When considering mixing and filming-forming characteristics, the organic solvent is preferably selected from the group consisting of DMF, 4-hydroxy-4-methyl-2-pentanone, ethylene glycol monoethyl ether, 2-methoxyethanol and a mixture thereof. Preferably, the resulting concentration of carbon nanotubes in the liquid coating composition ranges from 3 to 95 wt %, and the photoinitiator is used in an amount of 0.5 to 25 weight part per 100 weight part of carbon nanotube. When a co-photo initiator is used, the amount thereof ranges from 0.5 to 15 parts by weight per 100 part by weight of the photoinitiator.

The liquid coating composition is then applied evenly to the surface of a substrate. The materials of the substrate are not particularly limited, and a glass substrate, a silicone substrate or a plastic substrate can be used according to the desired purpose. The application of the liquid coating composition can be accomplished by any of the conventional coating methods well known in the art. Non-limiting examples of the coating method useful in the present invention include spin-coating, dip-coating, spray-coating, flow-coating and screen-printing, while spin-coating is most preferred in light of convenience and film evenness. For spin coating, the spin rate is determined between 500 and 2,500 rpm, depending on the viscosity of the coating composition and the desired film thickness.

After completion of the application of the liquid coating composition to the substrate, pre-baking for evaporating solvent is carried out at 80~120° C., preferably at 100° C. for 1~2 minutes, resulting in the deposition of a coating film on the substrate. Next, the coating film is exposed to UV light through a photomask having a desired pattern. Preferably, the exposure dose is controlled to be between 100~800 mJ/cm$^2$. Upon the exposure, at exposed areas, free radicals produced by the photoinitiators initiate photopolymerization of the double bond-containing functional groups attached to the surfaces of the carbon nanotubes, resulting in crosslinking of the carbon nanotubes. Consequently, the exposed areas of the coating film become insoluble, so in the subsequent developing process, the dissolution rate of the exposed area is significantly slower than the unexposed area and, due to the difference in the dissolution rate between the exposed and unexposed areas, after the development process, only the exposed area will remain on the substrate to produce the desired pattern.

In the present invention, the developer is not particularly limited and any of the organic solvents commonly used in the field of photolithography can be adopted, while DMF, 4-hydroxy-4-methyl-2-pentanone, ethylene glycol monoethyl ether and 2-methoxyethanol are preferred.

In the present invention, the surface-modified carbon nanotubes may be used in combination with other co-polymerizable monomers or oligomers containing double bonds for the purpose of improving the evenness of the coating film and further providing particular functionality of the monomers or oligomers. Preferable examples of the co-polymerizable monomer include, without limitation, methyl methacrylate, allyl acrylate, benzyl acrylate, butoxyethyl acrylate, 2-cyanoethyl acrylate, cyclohexyl acrylate, dicyclopentenyl acrylate, N,N-diethylaminoethyl acrylate, 2-ethoxyethyl acrylate, 2-ethylhexyl acrylate, glycerol methacrylate, glycidyl methacrylate, heptadecafluorodecyl acrylate, 2-hydroxyethyl acrylate, 2-hydroxy-3-methacryloxypropyl trimethyl ammonium chloride, 2-hydroxypropyl acrylate, isobornyl acrylate, isodecyl acrylate, isooctyl acrylate, lauryl acrylate, 2-methoxyethyl acrylate, methoxytriethyleneglycol acrylate, nonylphenoxy polyethyleneglycol acrylate, octafluoropentyl acrylate, phenoxyhydroxypropyl acrylate, phenoxy methacrylate, phosphoric acid methacrylate, phthalic acid acrylate, polyethyleneglycol methacrylate, stearyl acrylate, tetrafluoropropyl acrylate, trifluoroethyl acrylate, vinyl acetate, N-vinyl caprolactam, N-vinyl-2-pyrrolidone and acrylamide. Preferable examples of the co-polymerizable oligomer include, without limitation, epoxy acrylate, urethane acrylate and polybutadiene acrylate. Such co-polymerizable monomers or oligomers are added to the liquid coating composition comprising the surface-modified carbon nanotubes with a weigh ratio of carbon nanotube to monomer or oligomer (i.e. weight of carbon nanotube: weight of monomer or oligomer) ranging from 5:95 to 99:1, preferably 10:90~95:5.

Furthermore, polymers or oligomers not having any double bond may be added to the liquid coating composition as a coating binder for increasing the thickness or evenness of the coating film. The type or amount of the coating binder is not particularly limited and can be determined according to common practice in polymer coating.

The present invention can be more clearly understood by referring to the following examples. It should be understood that the following examples are not intended to restrict the scope of the present invention in any manner.

PRODUCTION EXAMPLE 1

Purification of Carbon Nanotubes

In a 500 ml flask equipped with a reflux tube, 100 mg of carbon nanotube (ILJIN CNT AP-Grade, Iljin Nanotech Co., Ltd., Korea) was refluxed with 50 ml of distilled water at 100° C. for 12 hrs and then filtered. The carbon nanotubes recovered from the filtration were dried at 60° C. for 12 hrs and washed with toluene so as to remove residual fullerene. Then, the remaining soot was collected and heated in a furnace at a temperature of about 470° C. for 20 minutes, followed by washing with plenty of 6M HCl solution to afford pure carbon nanotubes without metallic impurities.

PRODUCTION EXAMPLE 2

Surface Modification of the Carbon Nanotubes with Carboxyl Groups (Carboxylation)

In a sonicator filled with a mixed acid solution of nitric acid:sulfuric acid=7:3 (v/v), the pure carbon nanotubes obtained from the Production Example 1 were refluxed for 24 hrs. After being recovered from the filtration through a 0.2 μm polycarbonate filter, the carbon nanotubes were refluxed again in nitric acid at 90° C. for 45 hrs. Subsequently, the slurry was centrifuged at 12,000 rpm and the resulting supernatant was filtered through a 0.1 μm polycarbonate filter. Carbon nanotubes recovered from the filtration were dried at 60° C. for 12 hrs and dispersed in DMF, followed by filtration through a 0.1 μm polycarbonate filter for size sorting.

PRODUCTION EXAMPLE 3

Modification of the Surfaces of the Carbon Nanotubes with Double Bond-Containing Functional Group (1)

0.03 g of the carboxylated carbon nanotube obtained from the Production Example 2 was added to 20 ml of DMF and homogeneously dispersed by ultrasonification for 1 hr. To the dispersion was added a solution of 10 ml of TEA and 20 ml of DMF and the resulting dispersion was stirred for 1 hr. After the dispersion being placed in an ice-bath for cooling reaction-heat, 5 ml of acryloyl chloride mixed with 100 ml of DMF was slowly added to the dispersion drop by drop over 2 hrs with stirring and the mixture was allowed to react at room temperature for 24 hrs. At the completion of the reaction, the reaction mixture was added to 300 ml of distilled water and the resulting solids were recovered by filtration through a 0.2 μm polycarbonate filter. The solids were repeatedly washed with water and diethyl ether, 3 times respectively, so as to wash off unreacted acryloyl chloride. The washed solids were dried in vacuum at room temperature to afford 0.02 g of acrylated carbon nanotubes. The existence of acryl groups on the surfaces of the carbon nanotubes was examined by Raman spectrum.

PRODUCTION EXAMPLE 4

Modification of the Surfaces of the Carbon Nanotubes with Double Bond-Containing Functional Group (2)

0.03 g of the carboxylated carbon nanotube obtained from the Production Example 2 was added to 20 ml of DMF and homogeneously dispersed by ultrasonification for 1 hr. To the dispersion was added a solution of 12 ml of TEA and 20 ml of DMF and the resulting dispersion was stirred for 1 hr. After the dispersion being placed in an ice-bath for cooling reaction heat, 8 ml of vinylbenzyl chloride mixed with 100 ml of DMF was slowly added to the dispersion drop by drop over 2 hrs with stirring and the mixture was allowed to react at room temperature for 24 hrs. At the completion of reaction, the reaction mixture was added to 400 ml of distilled water, and the resulting solids were recovered by filtration through a 0.2 μm polycarbonate filter. The solids were repeatedly washed with water and diethyl ether, 3 times respectively, so as to wash off unreacted vinylbenzyl chloride. The washed solids were dried in vacuum at room temperature to afford 0.015 g of vinylbenzylated carbon nanotubes. The existence of vinylbenzyl groups on the surfaces of the carbon nanotubes was examined by Raman spectrum.

EXAMPLE 1

Formation of Negative Pattern (1) Using the Surface-Modified Carbon Nanotubes

A liquid coating composition having the following composition was prepared using the acrylated carbon nanotubes obtained from the Production Example 3:

| | |
|---|---|
| acrylated carbon nanotubes | 0.01 g |
| photoinitiator (Irgacure 907, Ciba Specialty Chemicals Ltd.) | 0.0002 g |
| DMF | 1 g |

After stirring for 1 hr for mixing the ingredients, the liquid coating composition was applied onto a silicon wafer by spin coating at 500 rpm, followed by drying at 100° C. for 1 minute to evaporate solvent. The resulting coating film was masked with a photomask of a desired pattern and then exposed to UV light at an exposure dose of 500 mJ/cm$^2$. Subsequently, the exposed film was developed with DMF for 20 seconds to afford a negative pattern of acrylated carbon nanotubes.

EXAMPLE 2

Formation of Negative Pattern (2) Using the Surface-Modified Carbon Nanotubes

A liquid coating composition having the following composition was prepared using the acrylated carbon nanotubes obtained from the Production Example 3:

| | |
|---|---|
| acrylated carbon nanotubes | 0.01 g |
| photoinitiator (Irgacure 907, Ciba Specialty Chemicals Ltd.) | 0.0003 g |
| co-photoinitiator (BASF Michlars Ketone) | 0.0001 g |
| DMF | 1 g |

After stirring for 1 hr for mixing the ingredients, the liquid coating composition was applied onto a silicon wafer by spin coating at 500 rpm, followed by drying at 100° C. for 1 minute to evaporate solvent. The resulting coating film was masked with a photomask of a desired pattern and then exposed to UV light at an exposure dose of 350 mJ/cm². Subsequently, the exposed film was developed with DMF for 20 seconds to afford a negative pattern of acrylated carbon nanotubes.

EXAMPLE 3

Formation of Negative Pattern (3) Using the Surface-Modified Carbon Nanotubes

A liquid coating composition having the following composition was prepared using the acrylated carbon nanotubes obtained from the Production Example 4:

| | |
|---|---|
| vinylbenzylated carbon nanotubes | 0.01 g |
| photoinitiator (Irgacure 651, Ciba Specialty Chemicals Ltd.) | 0.0002 g |
| photoinitiator (DITX, Nippon kagaku Co. Ltd.) | 0.0001 g |
| DMF | 2 g |

After stirring for 1 hr for mixing the ingredients, the liquid coating composition was applied onto a silicon wafer by spin coating at 500 rpm, followed by drying at 100° C. for 1 minute to evaporate solvent. The resulting coating film was masked with a photomask of a desired pattern and then exposed to UV light at an exposure dose of 400 mJ/cm². Subsequently, the exposed film was developed with DMF for 20 seconds to afford a negative pattern of vinylbenzylated carbon nanotubes.

EXAMPLE 4

Formation of Negative Pattern (4) Using the Surface-Modified Carbon Nanotubes

A liquid coating composition having the following composition was prepared using the acrylated carbon nanotubes obtained from the Production Example 3:

| | |
|---|---|
| acrylated carbon nanotubes | 0.01 g |
| polymer binder (polystyrene, Mw = 5,000) | 1.5 g |
| photoinitiator (Irgacure 184, Ciba Specialty Chemicals Ltd.) | 0.0002 g |
| photoinitiator (DITX, Nippon Kagaku Co. Ltd.) | 0.0001 g |
| DMF | 2 g |
| toluene | 1 g |

After stirring for 1 hr for mixing the ingredients, the liquid coating composition was applied onto a silicon wafer by spin coating at 800 rpm, followed by drying at 100° C. for 1 minute to evaporate solvent. The resulting coating film was masked with a photomask of a desired pattern and then exposed to UV light at an exposure dose of 600 mJ/cm². Subsequently, the exposed film was developed with DMF for 30 seconds to afford a negative pattern of acrylated carbon nanotubes.

EXAMPLE 5

Formation of Negative Pattern (5) Using the Surface-Modified Carbon Nanotubes

A liquid coating composition having the following composition was prepared using the acrylated carbon nanotubes obtained from the Production Example 3:

| | |
|---|---|
| acrylated carbon nanotubes | 0.01 g |
| polymerizable monomer (glycidyl methacrylate) | 0.2 g |
| photoinitiator (Irgacure 651, Ciba Specialty Chemicals Ltd.) | 0.0001 g |
| photoinitiator (DITX, Nippon Kagaku Co. Ltd.) | 0.0001 g |
| DMF | 2 g |

After stirring for 1 hr for mixing the ingredients, the liquid coating composition was applied onto a silicon wafer by spin coating at 800 rpm, followed by drying at 100° C. for 1 minute to evaporate solvent. The resulting coating film was masked with a photomask of a desired pattern and then exposed to UV light at an exposure dose of 600 mJ/cm². Subsequently, the exposed film was developed with DMF for 30 seconds to afford a negative pattern of acrylated carbon nanotubes.

As described above, by virtue of the present invention, desired patterns of carbon nanotubes can be easily made on the surfaces of various substrates using the conventional photolithography procedure.

The simple modification and change of the present invention will be readily made by any skilled person in the art and it should be understood that all of such modification and change are encompassed within the scope of the present invention.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A method of forming a negative pattern of carbon nanotubes which comprises the steps of:
   (a) providing surface-modified carbon nanotubes by introducing double bond-containing functional groups into the surface of the carbon nanotubes;
   (b) dispersing the surface-modified carbon nanotubes in an organic solvent along with a photoinitiator to obtain a liquid coating composition;
   (c) applying the liquid coating composition to a substrate and evaporating the organic solvent by prebaking to provide a coating film on the substrate;
   (d) exposing the coating film to UV light through a photomask having a desired pattern to induce photopolymerization of the carbon nanotubes in the exposed areas of the coating film; and
   (e) developing the coating film with an organic developer to remove unexposed areas of the coating film and to obtain a negative pattern of the carbon nanotubes.

2. The method according to claim 1, wherein the double bond-containing functional group is introduced from a compound having a structure of Formula 1 or Formula 2:

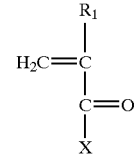

Formula 1

(wherein, R₁ is H or CH₃; and X is Cl, NH₂ or OH); and

Formula 2

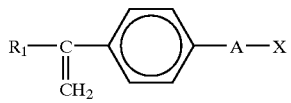

(wherein, $R_1$ is H or $CH_3$; A is $C_1$~$C_6$ alkylene or

(in which $R_2$ is direct bond or $C_1$~$C_6$ alkylene) ; and X is Cl, $NH_2$ or OH).

3. The method according to claim 1, wherein the carbon nanotubes are produced by an arc discharge method, a laser ablation method, a high temperature filament plasma chemical vapor deposition method, a microwave plasma chemical vapor deposition method, a thermochemical vapor deposition method or a thermal decomposition method.

4. The method according to claim 1, wherein the photoinitiator is selected from the group consisting of an acetophenone-based photoinitiator, a benzoin-based photoinitiator, a benzophenone-based photoinitiator, a thioxantone-based photoinitiator, a special grade photoinitiator and a co-polymerizable photoinitiator.

5. The method according to claim 4, wherein the special grade photoinitiator is selected from the group consisting of 1-phenyl-1,2-propanedione-2-(O-ethoxycarbonyl)oxime, 2,4,6-trimethyl benzoyl diphenyl phosphine oxide, methyl phenylglyoxylate, benzil, 9,10-phenanthraquinone, camphorquinone, dibenzosuberone, 2-ethylanthraquinone, 4,4'-diethylisophthalophenone and 3,3',4,4'-tetra(t-butylperoxyccarbonyl)benzophenone.

6. The method according to claim 4, wherein the co-polymerizable photoinitiator is selected from the group consisting of compounds of Formulas 3 to 6:

Formula 3

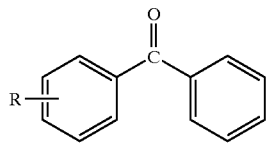

(wherein, R = (meth)acryl group);

-continued

Formula 4

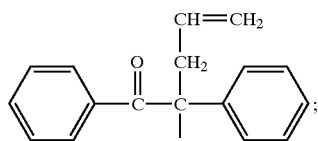

Formula 5

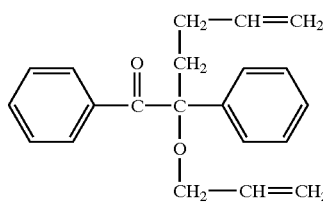

and

Formula 6

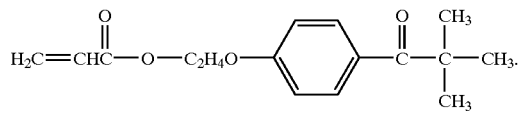

7. The method according to claim 1, wherein the substrate is selected from the group consisting of a glass substrate, a silicon substrate and a plastic substrate.

8. The method according to claim 1, wherein the liquid coating composition further comprises a co-photoinitiator.

9. The method according to claim 8, wherein the co-photoinitiator is selected from the group consisting of triethanolamine, methyldiethanolamine, triisopropanolamine, 4,4'-dimethylamino benzophenone, 4,4'-diethylamino benzophenone, 2-dimethylamino ethylbenzoate, 4-dimethylamino ethylbenzoate, 2-n-butoxyethyl-4-dimethylaminobenzoate, 4-dimethylamino isoamylbenzoate, 4-dimethylamino-2-ethylhexyl benzoate and Eosin Y.

10. The method according to claim 1, wherein the liquid coating composition further comprises co-polymerizable monomers or oligomers containing double bonds for the carbon nanotubes to copolymerize with the monomers or oligomers during the photo-polymerization step (d).

11. The method according to claim 1, wherein the liquid coating composition further comprises polymers or oligomers free of double bonds, as a coating binder.

\* \* \* \* \*